(12) United States Patent
Kim (10) Patent No.: US 7,579,209 B2
(45) Date of Patent: Aug. 25, 2009

(54) IMAGE SENSOR AND FABRICATING METHOD THEREOF

(75) Inventor: Sang Sik Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 384 days.

(21) Appl. No.: 11/320,908

(22) Filed: Dec. 30, 2005

(65) Prior Publication Data

US 2007/0102621 A1 May 10, 2007

(30) Foreign Application Priority Data

Nov. 10, 2005 (KR) .................. 10-2005-0107682

(51) Int. Cl.
*H01L 21/00* (2006.01)
(52) U.S. Cl. .............................. 438/71; 257/98; 438/70
(58) Field of Classification Search ................. 257/431, 257/432, 435, 88, 89, 98
See application file for complete search history.

(56) References Cited

U.S. PATENT DOCUMENTS

| 6,577,342 | B1 * | 6/2003 | Wester ..................... 348/340 |
| 6,861,686 | B2 * | 3/2005 | Lee et al. .................. 257/291 |
| 2003/0197228 | A1 * | 10/2003 | Okuda et al. ............... 257/369 |
| 2005/0200734 | A1 * | 9/2005 | Ahn et al. ................... 348/311 |
| 2005/0224694 | A1 * | 10/2005 | Yaung ...................... 250/208.1 |
| 2006/0138480 | A1 * | 6/2006 | Adkisson et al. ........... 257/291 |
| 2006/0261426 | A1 * | 11/2006 | Hoague et al. .............. 257/432 |

* cited by examiner

*Primary Examiner*—Wai-Sing Louie
*Assistant Examiner*—Bilkis Jahan
(74) *Attorney, Agent, or Firm*—McKenna Long & Aldridge LLP

(57) ABSTRACT

An image sensor includes the steps of forming a sublayer including a photodiode, a transistor and a metal line on a substrate, forming a pattern layer on the sublayer to be overlapped with the photodiode and to having a curved surface, and forming a combined color filter and microlens on the pattern layer to have a curved surface.

5 Claims, 9 Drawing Sheets

Figure 1:
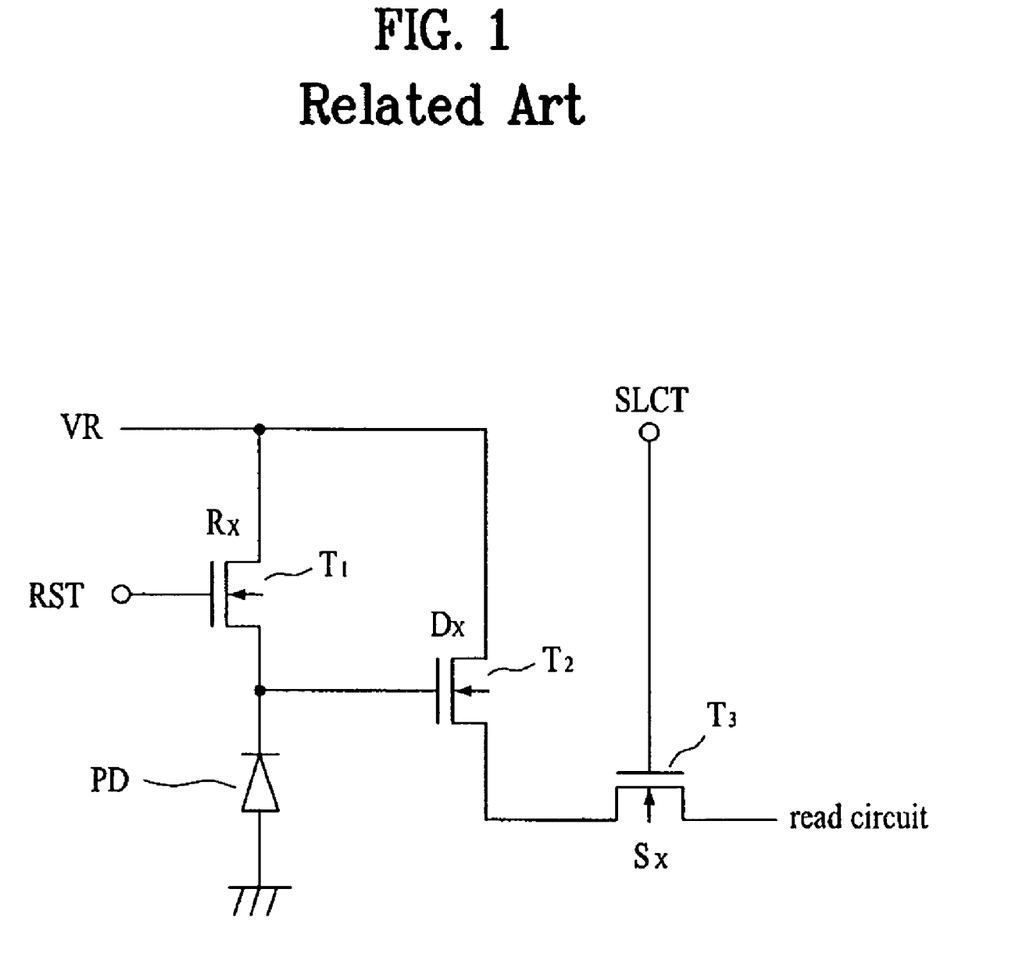
FIG. 1 is a diagram of an equivalent circuit of a general 3T type CMOS image sensor.
Figure 2:
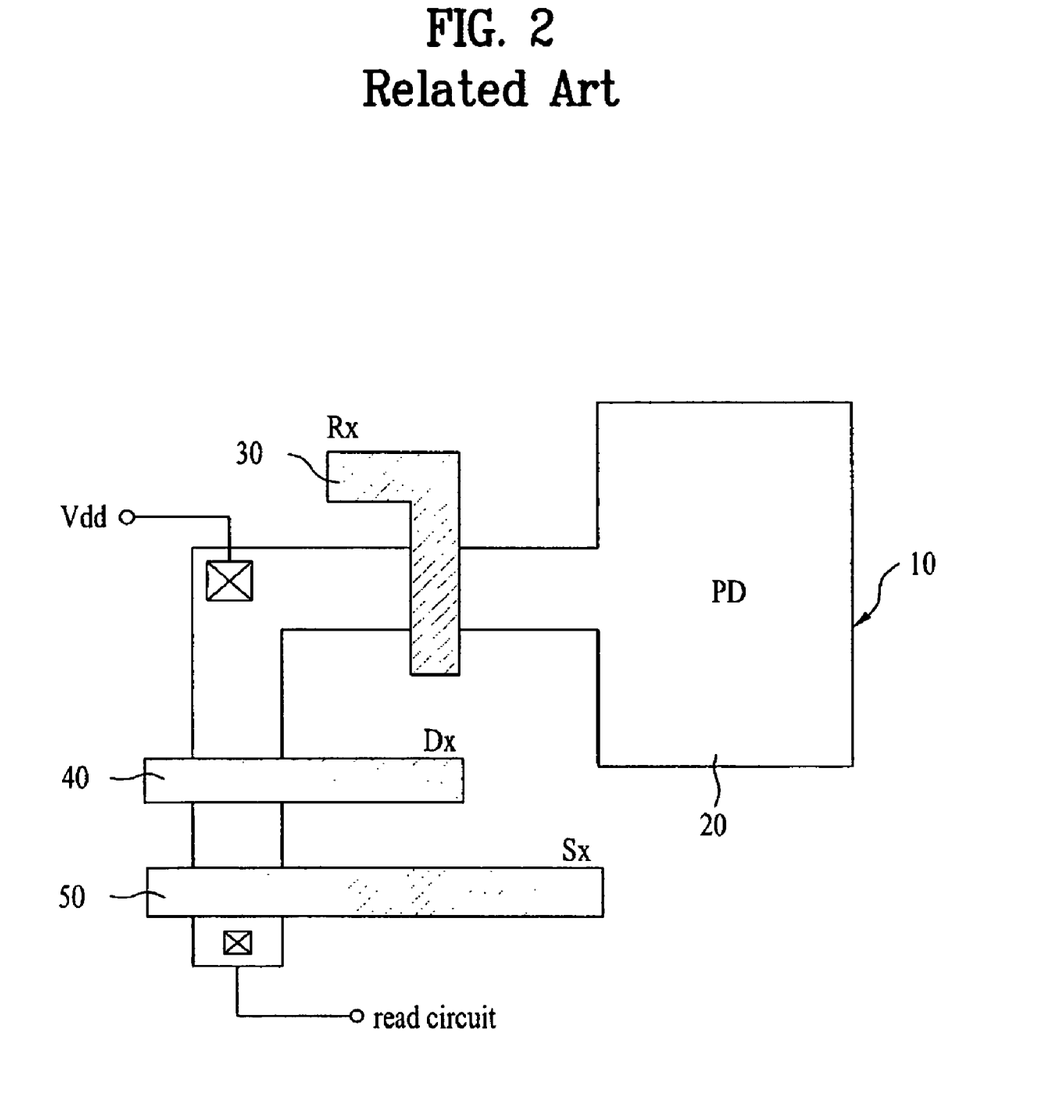
FIG. 2 is a layout of a unit pixel of a general 3T type CMOS image sensor.
Figure 3:
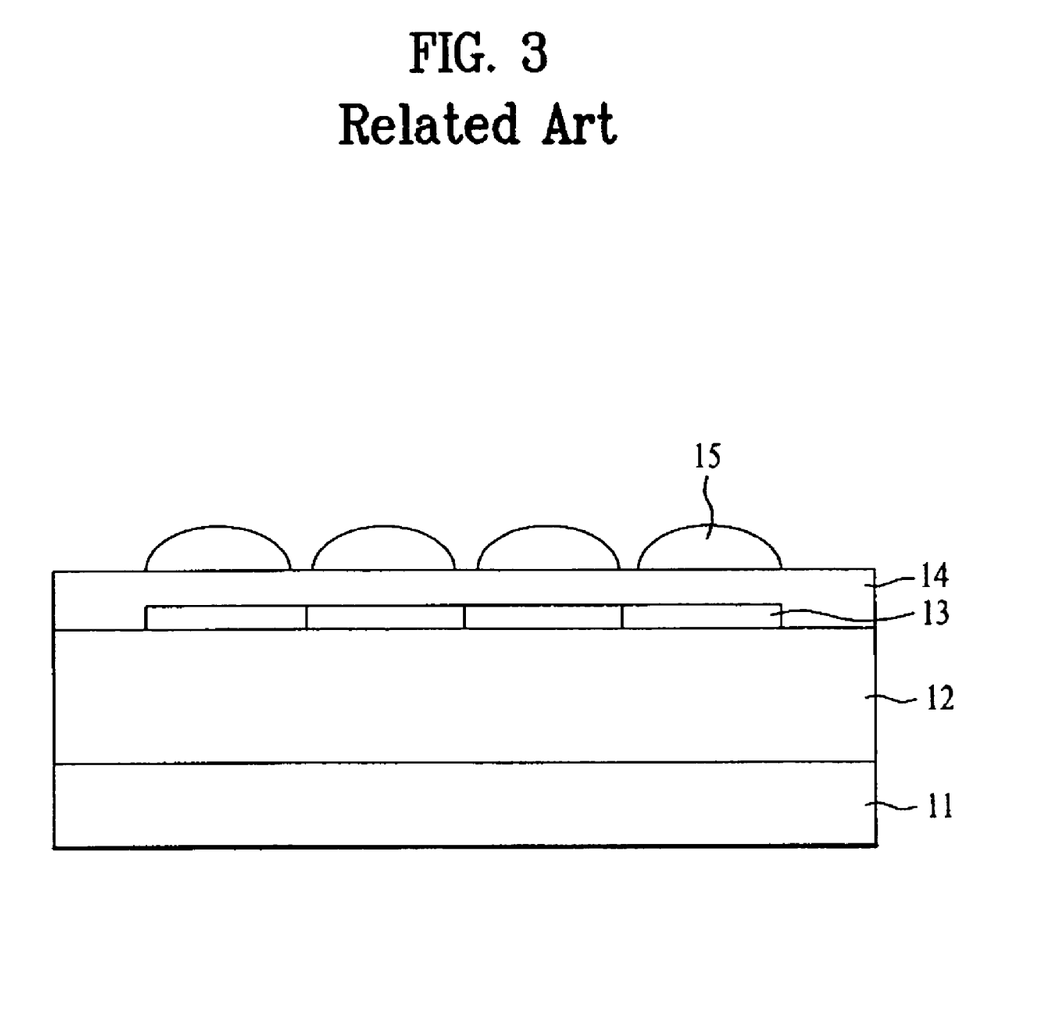
FIG. 3 is a cross-sectional diagram of an image sensor according to a related art.

… planarizing layer 14 is formed on the color filter layer 13 for uniformity of the microlenses 15 that will be formed over the color filter layer 13.

In particular, the planarizing layer 14 is hardened by a curing process. The curing process is carried out in a hot plate. The process temperature of the curing is at least 200° C. or above, and the physical property of a surface of the planarizing layer 14 varies according to a solvent component coming from a sealed convection type oven during curing. Hence, flowability of the microlenses 15 that will be formed on the planarizing layer 14 is varied. Thus, if the flowing property of the microlenses 15 is varied, uniformity of the microlenses 15 becomes irregular to cause a light loss.

However, the conventional image sensor and fabricating method thereof have at least the following problem.

After completion of the color filter layer for color separation, the planarizing layer is formed for the uniformity of the surface of the microlenses that will be formed over the color filter layer. In doing so, the planarizing layer is hardened by the curing process. Since the curing process is carried out in the hot plate at the temperature of 200° C. or above, the physical property of the surface of the planarizing layer varies according to the solvent component coming from the sealed convection type oven in curing. Hence, the flowability of the microlenses that will be formed on the planarizing layer is varied. Thus, if the flowing property of the microlenses is varied, uniformity of the microlenses becomes irregular, which causes an unwanted reduction in light.

SUMMARY OF THE INVENTION

Accordingly, the present invention is directed to an image sensor and fabricating method thereof that substantially obviate one or more problems due to limitations and disadvantages of the related art.

The present invention provides an image sensor and fabricating method thereof, by which total photoelectric conversion is enabled without a reduction in light by enhancing the surface uniformity of microlenses in each area.

Additional advantages and features of the invention will be set forth in the description which follows and will become apparent to those having ordinary skill in the art upon examination of the following. These and other advantages of the invention may be realized and attained by the structure particularly pointed out in the written description and claims hereof as well as the appended drawings.

To achieve these and other advantages and in accordance with the invention, as embodied and broadly described herein, an image sensor according to the present invention includes a substrate; a sublayer on the substrate, the sublayer including a photodiode, a transistor, and a metal line; a pattern layer on the sublayer to be overlapped with the photodiode, the pattern layer having a curved surface; and a combined color filter and microlenses on the pattern layer, the combined color filter and microlenses having a curved surface.

The combined color filter and microlenses can include a photosensitive resin.

The photosensitive resin can enable a light of a specific wavelength to be selectively transmitted.

The combined color filter and microlenses can include a red combined color filter and microlenses, a blue combined color filter and microlenses and a green combined color filter and microlenses.

The image sensor can further include a planarizing layer over the substrate including the combined color filter and microlenses.

The image sensor can further include a condensing lens on the combined color filter and microlenses.

The pattern layer can be spaced apart from a neighboring pattern layer by 0.5-1.5 μm.

In another aspect of the present invention, a method of fabricating an image sensor includes the steps of forming a sublayer, including a photodiode, a transistor, and a metal line on a substrate; forming a pattern layer on the sublayer to be overlapped with the photodiode and having a curved surface; and forming a combined color filter and microlenses on the pattern layer to have a curved surface.

The pattern layer forming step can include the steps of forming a protecting layer on the sublayer; selectively removing the protecting layer to remain over the photodiode only; forming a high density plasma oxide layer on the sublayer including the protecting layer; and etching back the high density plasma oxide layer until a surface of the sublayer is exposed.

The high density plasma oxide layer can be formed 500-5,000 Å thick.

The protecting layer can be formed of SiN.

The method can further include the step of forming a planarizing layer over the substrate, including the combined color filter and microlenses.

The method can further include the step of forming a condensing lens on the planarizing layer to be overlapped with the combined color filter and microlenses.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention, illustrate exemplary embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 4:
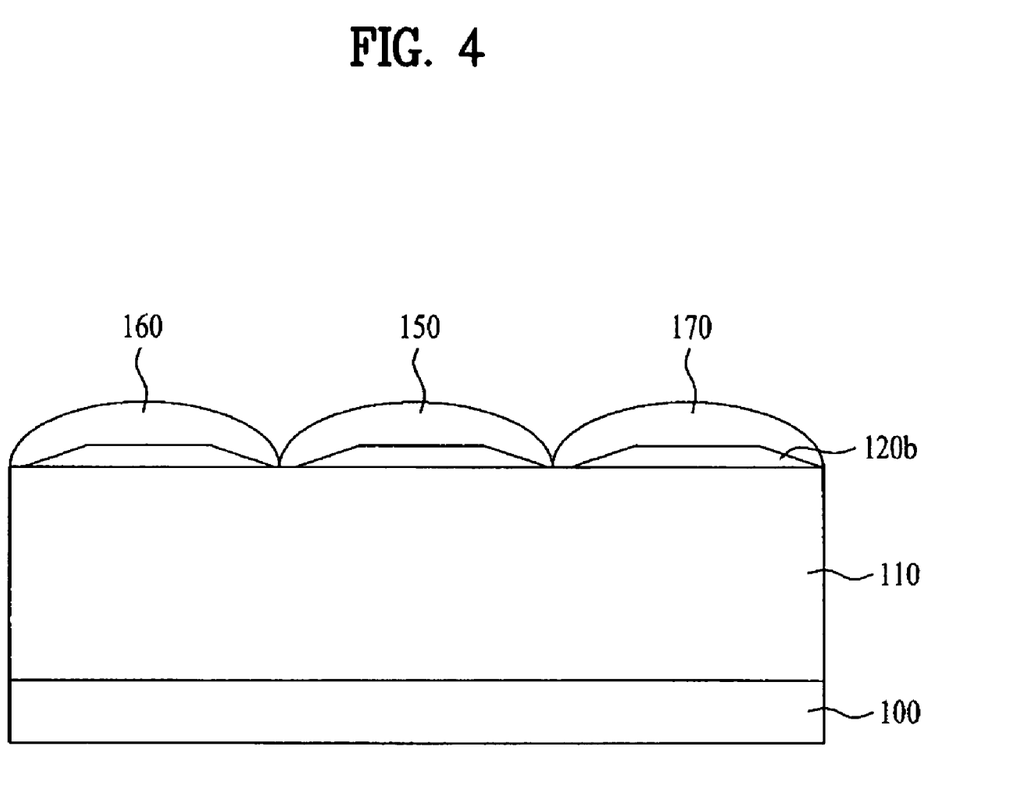
FIG. 4 is a cross-sectional diagram of an exemplary image sensor according to the present invention.

FIG. 4 is a cross-sectional diagram of an image sensor according to the present invention.

Referring to FIG. 4, an image sensor according to the present invention includes a substrate 100; a sublayer 110 on the substrate 100 to include a photodiode, various transistors and metal lines; a plurality of pattern layers 120b on the sublayer 110 overlapped with the photodiode to have curved surfaces, respectively; and R, G and B color filter layers 150, 160 and 170 regularly arranged on a prescribed area of the pattern layers 120b along the curved surfaces of the pattern layers 120b, respectively. In this case, the pattern layers 120b are spaced apart from each other to leave 0.5-1 μm spacing between each. Each of the pattern layers 120b can be overlapped with the photodiode area to raise condensing efficiency.

In this case, a combined color filter and microlenses is formed of a photosensitive resin. And, the R, G and B color filter layers 150, 160 and 170 can be replaced by a complementary color filter, e.g., a cyan/yellow/magenta color filter.

Moreover, by further providing a planarizing layer over the substrate, including the combined color filter and microlenses or by further providing a condensing lens on the combined color filter and microlenses, the efficiency in condensing incoming light can be further enhanced.

FIGS. 5A to 5I are cross-sectional diagrams for a method of fabricating an image sensor according to the present invention.

Figure 5A:
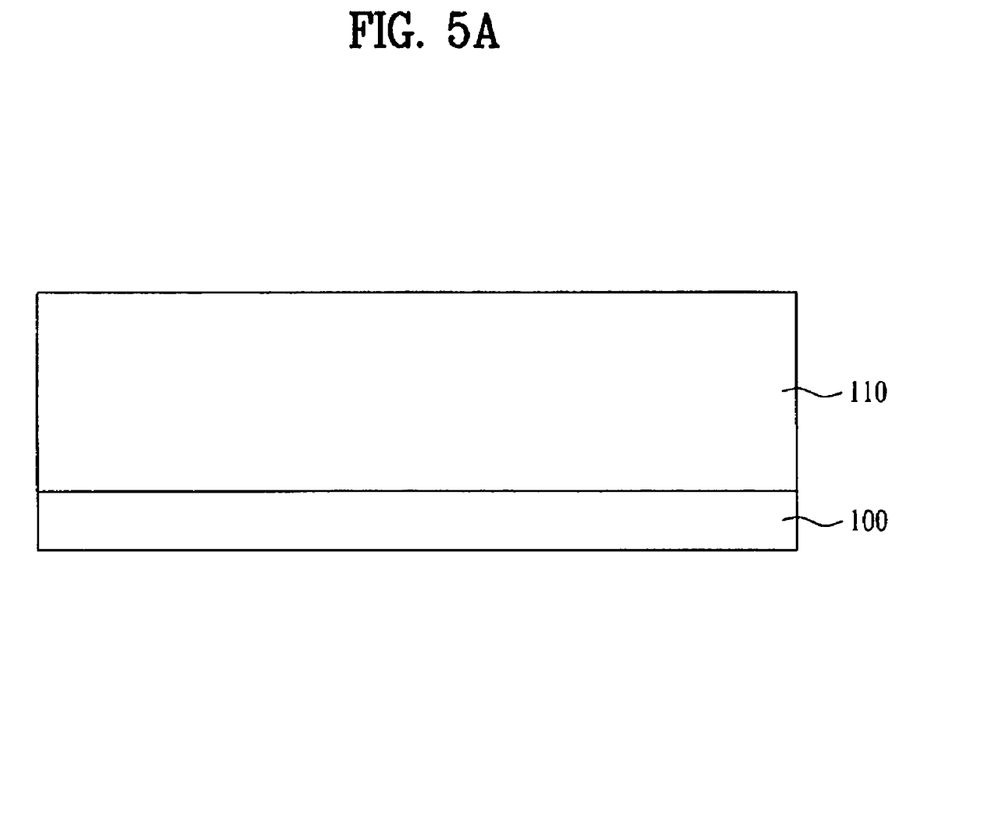
FIGS. 5A to 5I are cross-sectional diagrams of an image sensor fabricated in accordance with an exemplary embodiment of the present invention.

Referring to FIG. 5A, a sublayer including a photodiode (not shown), various transistors and metal lines are formed on a substrate 100.

Figure 5B:
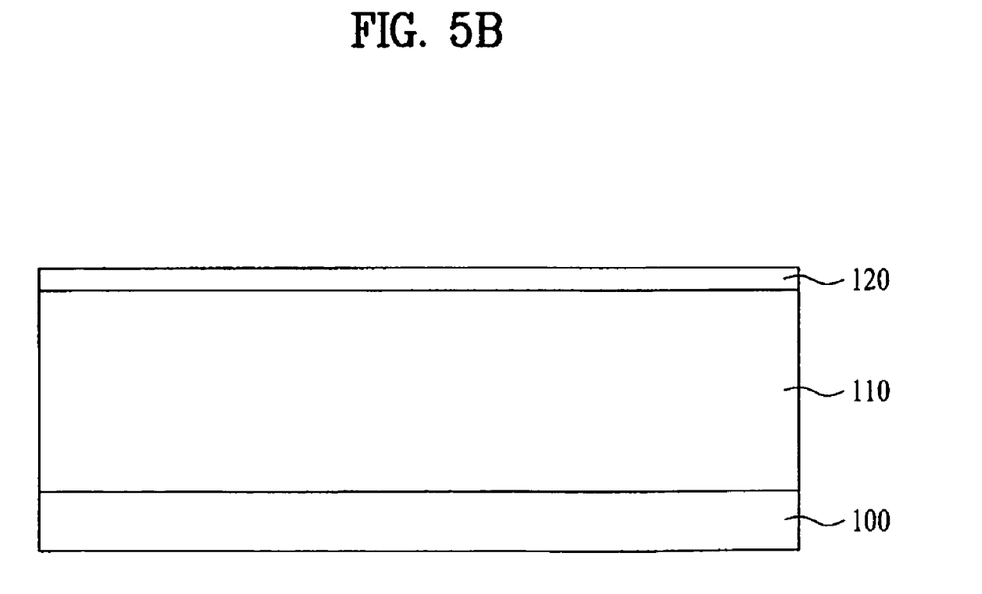

Referring to FIG. 5B, a first protecting layer 120 is formed of an insulator on the sublayer 110. The first protecting layer 120 is formed with an insulating layer of SiN or the like, for example.

Figure 5C:
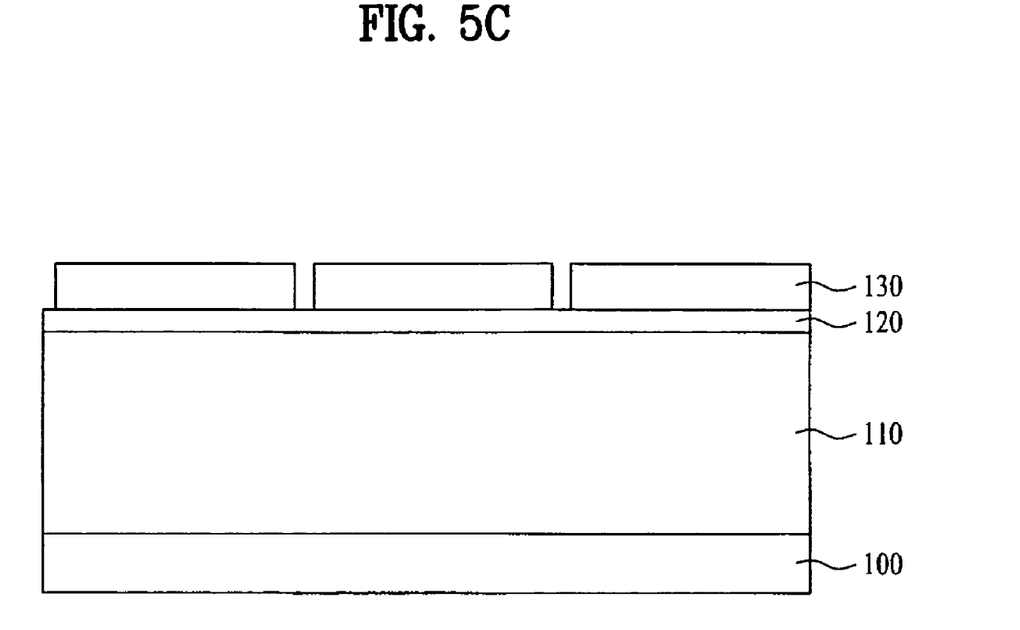

Referring to FIG. 5C, a photoresist is coated on the first protecting layer 120. A mask layer 130 is formed by selectively removing the photoresist to leave at least part overlapped with the photodiode by exposure and development. In this case, a width of a gap of the mask layer 130 is 0.5-1.5 μm. In doing so, the portion (not shown) of the photoresist overlapped with a pad is simultaneously removed to form a pad opening. The pad opening acquires a voltage impression and output via the pad.

Figure 5D:
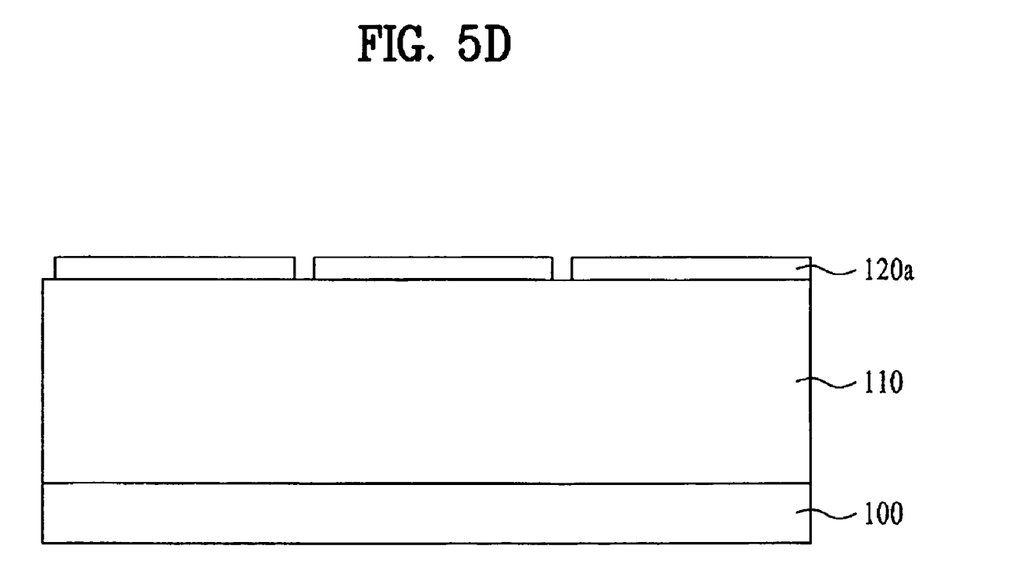

Referring to FIG. 5D, the first protecting layer is selectively removed using the mask layer 130 to form a first pattern layer 120a.

Figure 5E:
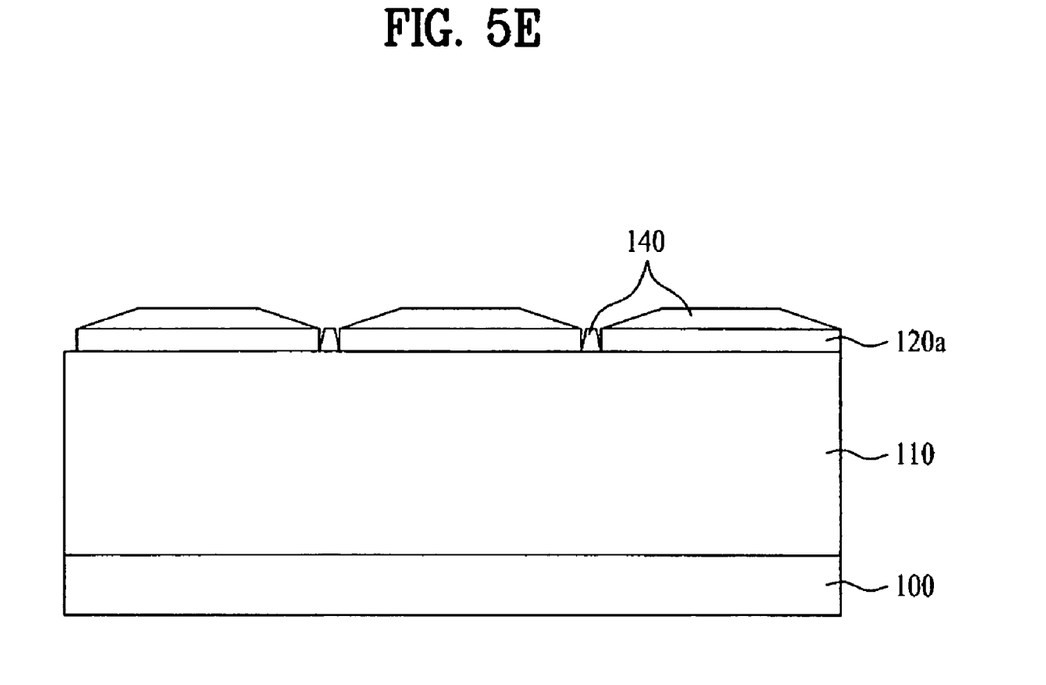

Referring to FIG. 5E, an high density plasma (HDP) oxide layer 140 is deposited 500-5,000 Å thick on the sublayer 110, including the first pattern layer 120a. In this case, since the HDP oxide layer 140 is deposited under high density plasma, it is difficult to deposit the oxide layer 140 on an uneven surface locally. Hence, the oxide layer 140 is deposited at a slant.

Figure 5F:
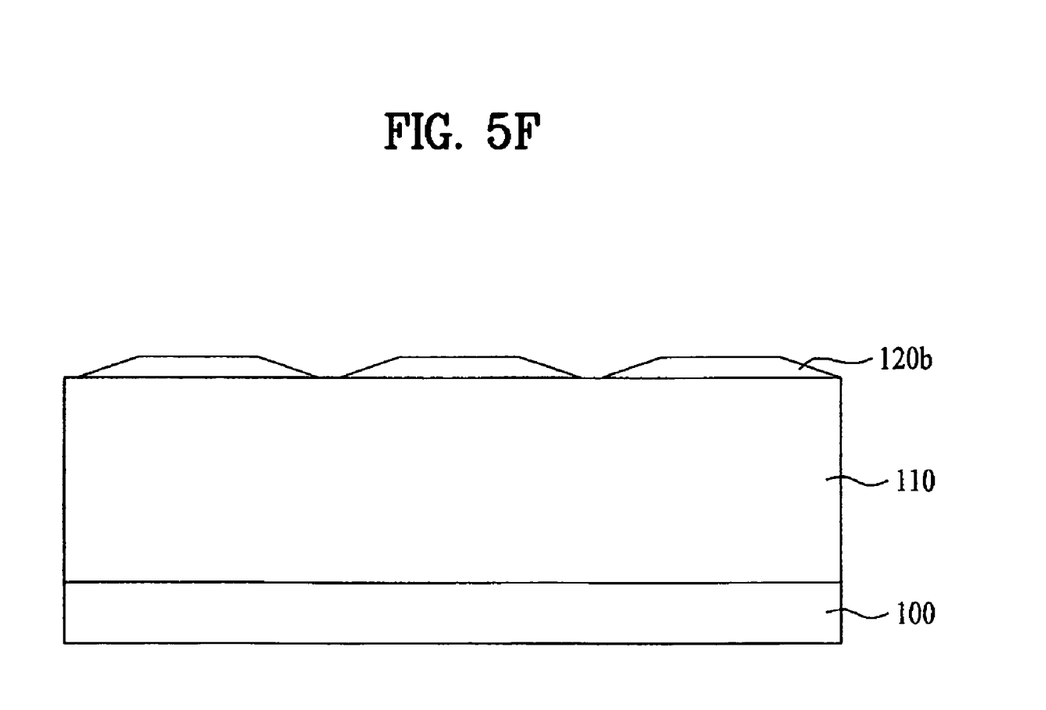

Referring to FIG. 5F, dry etch-back is carried out on the HDP oxide layer 140 to remove an edge portion of the first pattern layer 120a which is formed of SiN or the like. Hence, a first pattern layer 120b having a slope is formed.

Figure 5G:
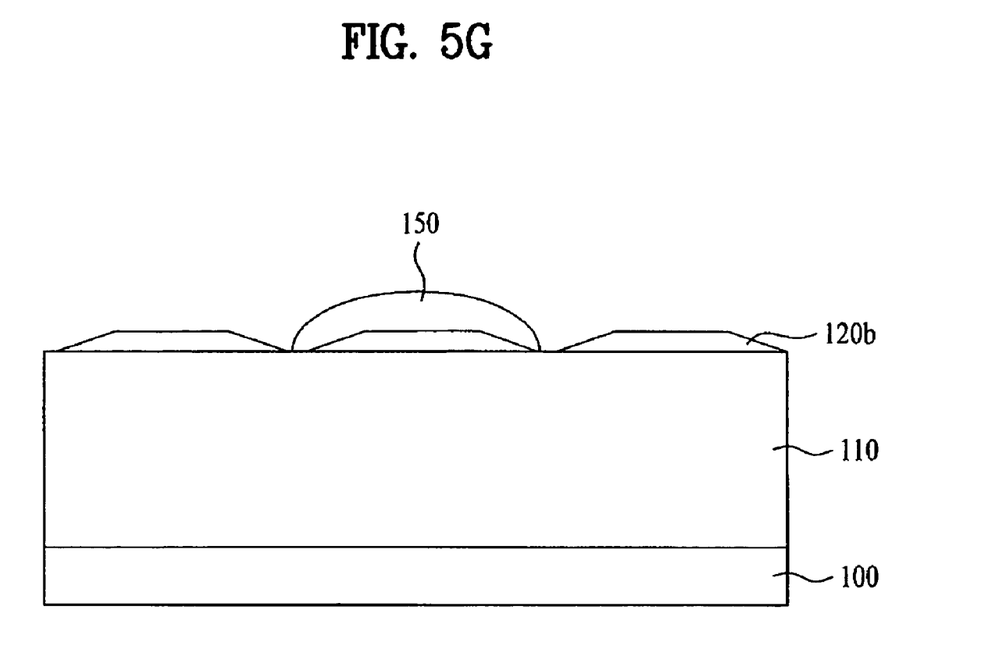

Referring to FIG. 5G, an R color filter layer 150 is formed on a prescribed area of the first pattern layer 120b to have a regular interval.

Figure 5H:
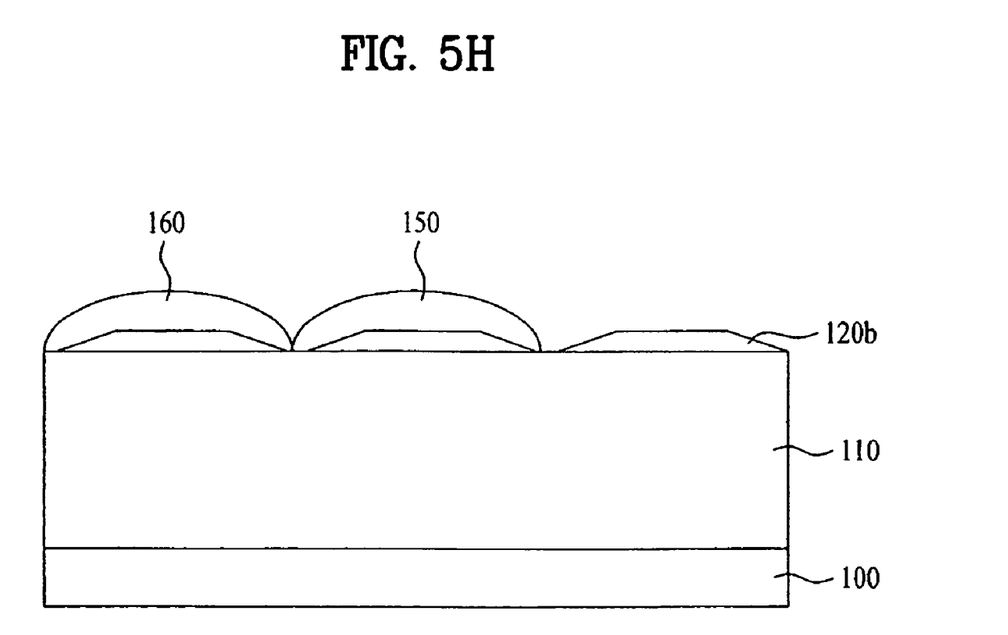

Referring to FIG. 5H, a G color filter layer 160 is formed on a prescribed area of the first pattern layer 120b to have a regular interval and not to be overlapped with the R color filter layer.

Figure 5I:
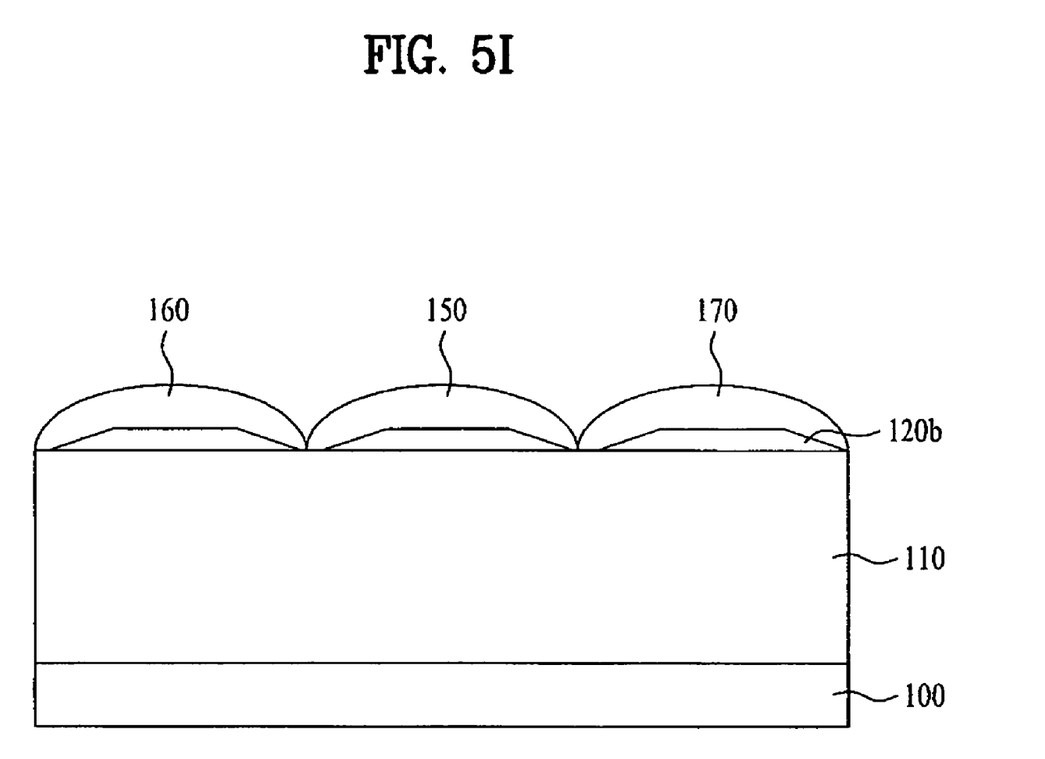

Referring to FIG. 5I, a B color filter layer 170 is formed on the first pattern layer 120b not to be overlapped with the R and G color filter layers 150 and 160.

Each of the R, G and B color filter layers 150, 160 and 170 can be formed of a pigment or photosensitive resin enabling a specific colored light to be only transmitted by photolithography. In doing so, since the photosensitive resin of a corresponding color is coated on the first pattern layer 120b to have the same contour of the curved surface of the first pattern layer 120b, each of the R, G and B color filter layers 150, 160 and 170 is operative as both a condensing microlens and a color filter. Hence, a separate process for forming a microlens can be omitted.

Optionally, another planarizing layer and a condensing microlens can be further provided over each of the R, G and B color filter layers 150, 160 and 170.

By configuring the color filter layer and the microlenses in one body, misalignment between the color filter layer and the microlenses can be minimized. Hence, throughput can be raised.

Moreover, the pattern layer having the curved surface is formed under the color filter layer to form the color filter layer having the function of the condensing lens. The color filter layer is formed by patterning the pigment or photosensitive resin to be regularly arranged on the pattern layer. Hence, a separate process for maintaining the curved surface of the color filter layer can be omitted, and or the curved surface uniformity can be enhanced. As such, light loss can be prevented.

By forming the color filter layer and the condensing microlenses in one process, the fabricating method of the present invention is simpler than the conventional method of forming the color filter layer and the condensing microlenses separately. Hence, the present invention can reduce product cost and process time.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating an image sensor, comprising the steps of:

forming a sublayer including a photodiode, a transistor, and a metal line on a substrate;

forming a protecting layer on the sublayer;

forming a protecting layer pattern corresponding to the photodiode;

forming a high density plasma oxide layer on the sublayer, including the protecting layer, the high density oxide layer being deposited at a slanted or an uneven surface of the protecting layer pattern;

forming a pattern layer on the sublayer by etching back the high density plasma oxide layer and the protecting layer pattern, the pattern layer corresponding to the photodiode and having a curved surface with a slanted edge portion;

forming combined color filter and microlenses on the pattern layer to have a contour the same as a contour of the curved surface of the pattern layer.

2. The method of claim 1, wherein the high density plasma oxide layer is formed to have thickness of 500-5,000 Å.

3. The method of claim 1, wherein the protecting layer pattern forming step comprising the steps of:

coating a photoresist on the protecting layer;

forming a mask layer by selectively removing the photoresist to leave at least part overlapped with the photoresist by exposure and development; and forming a protecting layer pattern by etching the protecting layer using the mask.

4. The method of claim 1, further comprising the step of forming a planarizing layer over the substrate, including the combined color filter and microlenses.

5. The method of claim 4, further comprising the step of forming a condensing lens on the planarizing layer to be overlapped with the combined color filter and microlenses.

* * * * *